United States Patent
Roos

(10) Patent No.: US 9,563,222 B2
(45) Date of Patent: Feb. 7, 2017

(54) DIFFERENTIAL REFERENCE SIGNAL DISTRIBUTION METHOD AND SYSTEM

(71) Applicant: VARIAN MEDICAL SYSTEMS, INC., Palo Alto, CA (US)

(72) Inventor: Pieter Gerhard Roos, Sandy, UT (US)

(73) Assignee: VARIAN MEDICAL SYSTEMS, INC., Palo Alto, CA (US)

( * ) Notice: Subject to any disclaimer, the term of this patent is extended or adjusted under 35 U.S.C. 154(b) by 0 days.

(21) Appl. No.: 14/708,017

(22) Filed: May 8, 2015

(65) Prior Publication Data

US 2015/0326208 A1    Nov. 12, 2015

Related U.S. Application Data

(60) Provisional application No. 61/990,107, filed on May 8, 2014.

(51) Int. Cl.
*G05F 3/26* (2006.01)
*H03K 3/012* (2006.01)

(52) U.S. Cl.
CPC .............. *G05F 3/262* (2013.01); *H03K 3/012* (2013.01)

(58) Field of Classification Search
CPC ............. G05F 3/26; G05F 3/262; G05F 3/265
See application file for complete search history.

(56) References Cited

U.S. PATENT DOCUMENTS

| | | | | |
|---|---|---|---|---|
| 4,442,398 A * | 4/1984 | Bertails | ................... | G05F 3/262 323/315 |
| 5,894,245 A * | 4/1999 | Cho | ...................... | H03F 3/3028 330/253 |
| 5,955,874 A * | 9/1999 | Zhou | ....................... | G05F 3/247 323/315 |
| 6,639,456 B2 * | 10/2003 | Paulus | .................... | H03F 3/265 323/315 |
| 7,046,077 B2 * | 5/2006 | Ozasa | ..................... | G05F 3/262 327/541 |
| 7,057,448 B2 * | 6/2006 | Tanigawa | ................ | G05F 3/262 327/543 |
| 7,129,796 B2 * | 10/2006 | Goto | .................... | H03K 3/0315 331/17 |
| 7,180,794 B2 * | 2/2007 | Matsue | .................. | G11C 5/145 327/534 |
| 7,391,274 B2 * | 6/2008 | Hsu | ........................ | H03K 3/011 331/185 |
| 7,872,463 B2 * | 1/2011 | Jongsma | ................ | G05F 3/262 323/315 |

* cited by examiner

*Primary Examiner* — Jeffrey Zweizig
(74) *Attorney, Agent, or Firm* — SU IP Consulting

(57) ABSTRACT

In a reference signal distribution system, a first subsystem is configured to distribute a reference signal to a second subsystem. The first subsystem includes multiple diode-connected devices biased by a reference current and configured to establish a differential voltage between a first node and a second node. The second subsystem includes multiple diode-connected devices driven by the differential voltage and configured to generate a copy current associated with the reference current.

11 Claims, 5 Drawing Sheets

US 9,563,222 B2

DIFFERENTIAL REFERENCE SIGNAL DISTRIBUTION METHOD AND SYSTEM

CROSS-REFERENCE TO RELATED APPLICATIONS

The present application claims the benefit of U.S. Provisional Application 61/990,107 filed May 8, 2014, which is incorporated herein by reference.

BACKGROUND

Unless otherwise indicated herein, the approaches described in this section are not prior art to the claims in this application and are not admitted to be prior art by inclusion in this section.

Reference signals are mostly required in integrated circuit (IC) subsystems, either for the purpose of analog signal processing computations (e.g., A/D conversion, thresholding, offset shifting, measurement reference, etc.), or to determine the bias level of analog circuits.

Accurate distribution of reference signals to multiple subsystems on a large or complex integrated circuit is a frequent challenge to designers, especially in the modern "system on a chip" approach. Due to the inaccuracy of the absolute values of IC component parameters (e.g., capacitance, resistance, transistor threshold and gain), it is difficult to generate precision reference voltages or currents on integrated circuits. Circuit designs, that are commonly used to generate precision reference currents or voltages, often occupy large space, consume much power, have special start-up requirements and may require active trimming during IC production. For these reasons, when precision referencing is needed in any IC system, it is usually preferable to generate only one such reference signal centrally, either on the chip, or by an external component. "Copies" of this reference signal are then distributed to the subsystems where it is needed.

Conventional approaches of distributing either reference voltage or reference current to various subsystems in a large integrated circuit are inadequate. For example, distribution of multiple copies of a current signal can lead to unwanted circuit complexity (the signal distribution to each destination requires an individual signal wire) and power consumption (due to centrally generating multiple copies of a current signal at a subsystem).

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

The technical details set forth in the following description enable a person skilled in the art to implement one or more embodiments of the present disclosure.

Figure 1:
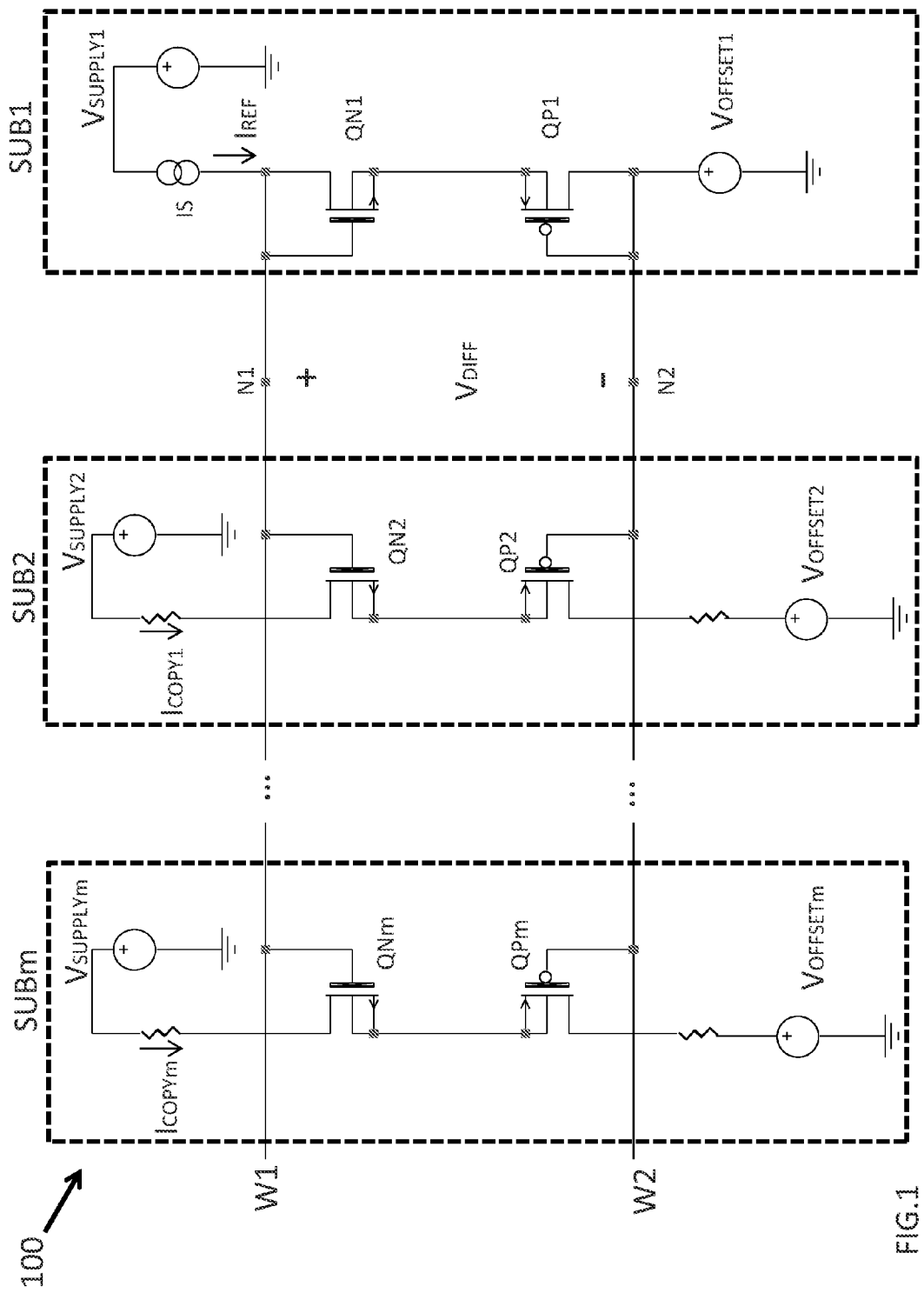
FIG. 1 is a functional schematic of one example reference signal distribution system.
Figure 2:
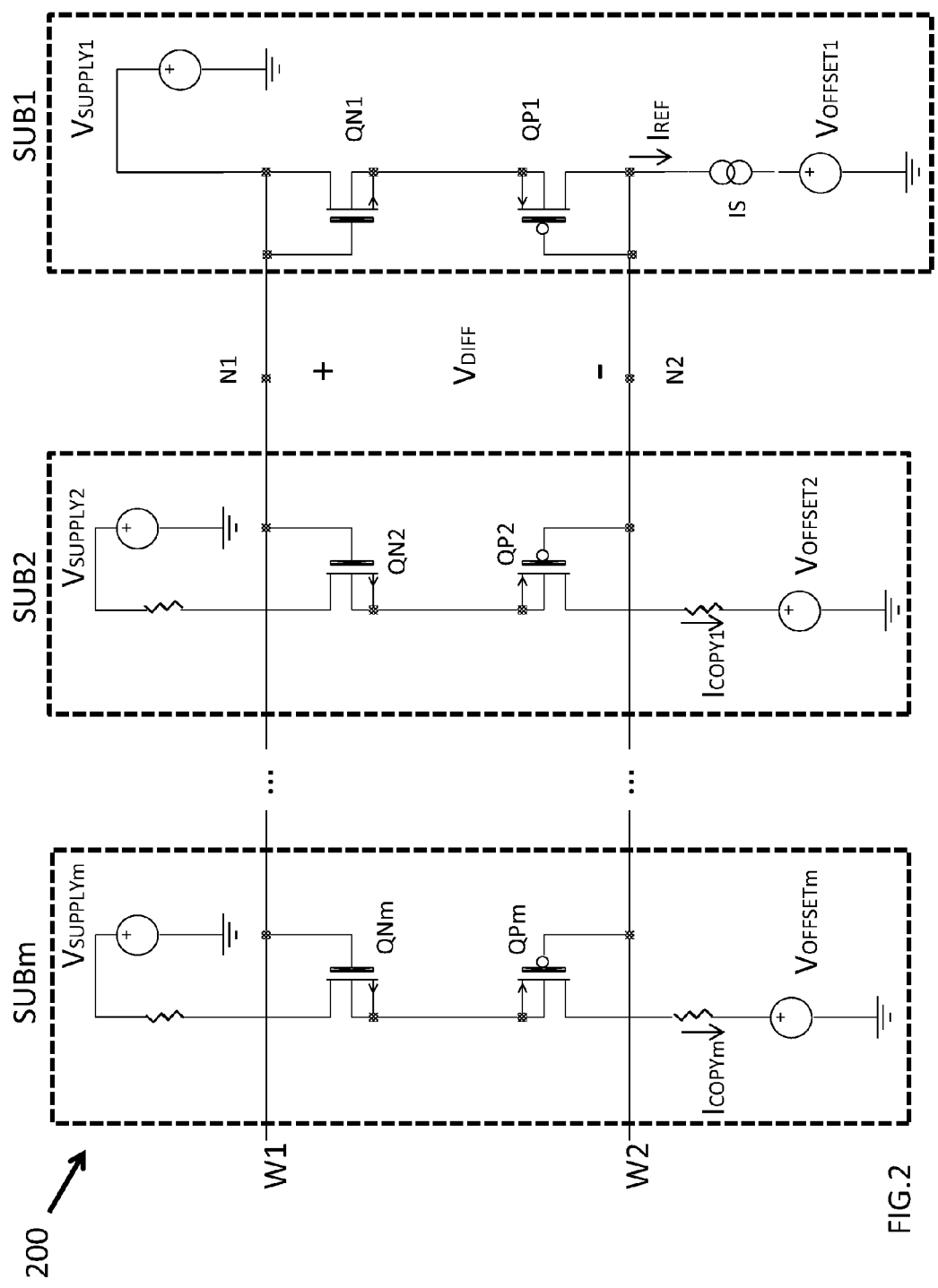
FIG. 2 is a functional schematic of another example reference signal distribution system.
Figure 3:
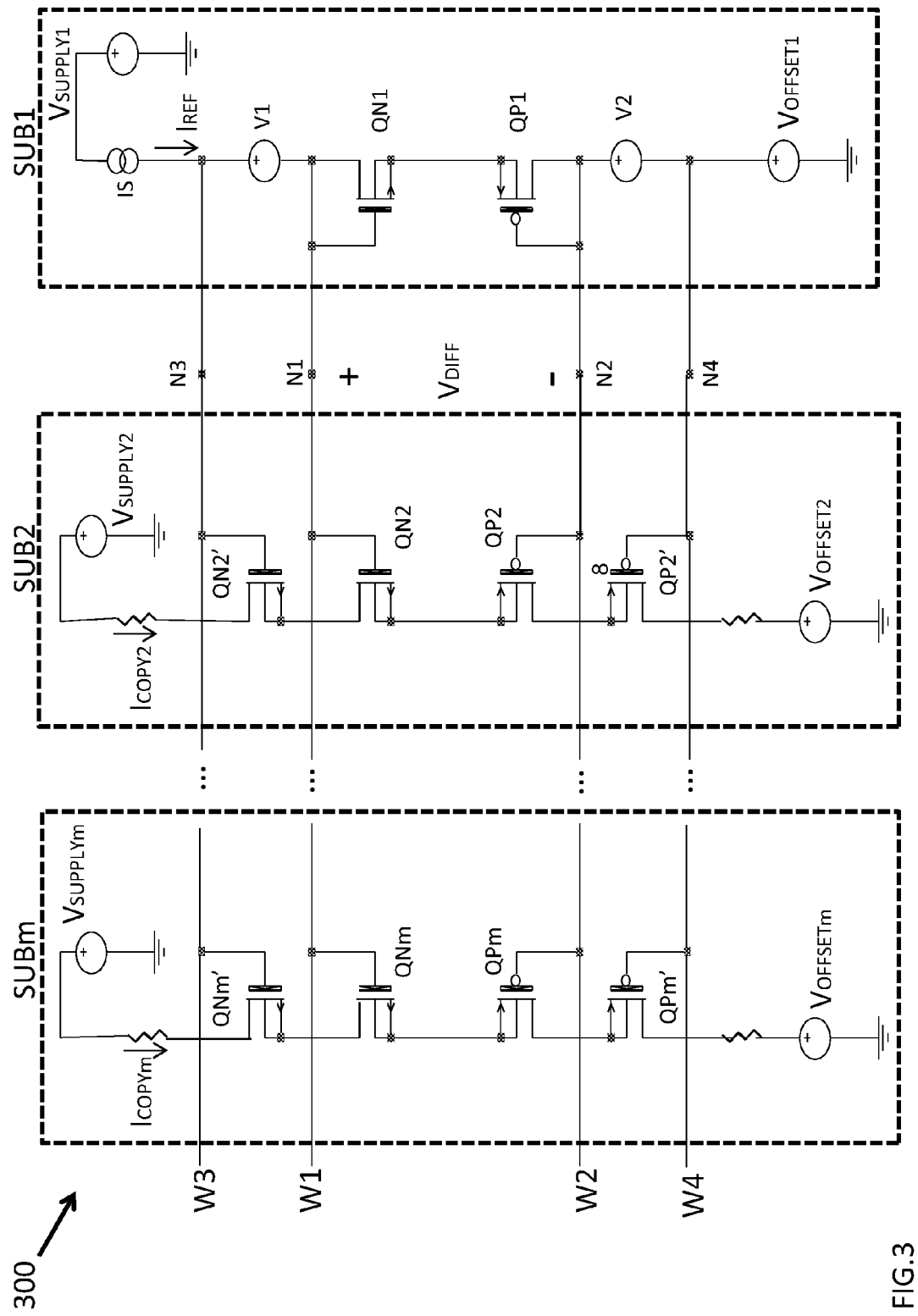
FIG. 3 is a functional schematic of another example reference signal distribution system.
Figure 4:
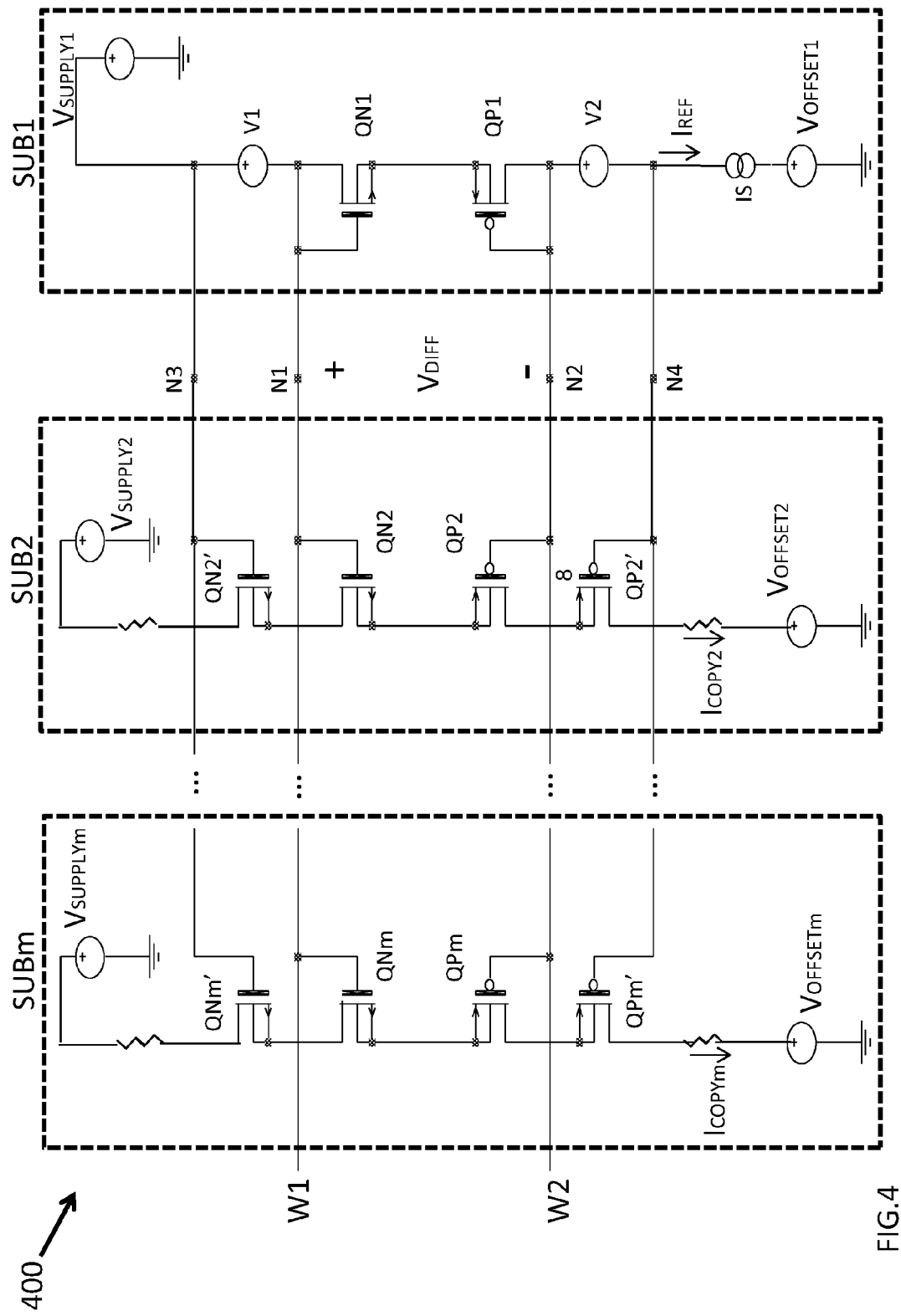
FIG. 4 is a functional schematic of another example reference signal distribution system.

FIG. 1 is a functional schematic of one example reference signal distribution system 100 in accordance with at least some embodiments of the present disclosure. FIG. 2 is a functional schematic of another example reference signal distribution system 200 in accordance with at least some embodiments of the present disclosure. FIG. 3 is a functional schematic of another example reference signal distribution system 300 in accordance with at least some embodiments of the present disclosure. FIG. 4 is a functional schematic of another example reference signal distribution system 400 in accordance with at least some embodiments of the present disclosure. Each of the reference signal distribution systems 100, 200, 300 and 400 includes a plurality of subsystems SUB1-SUBm (m is a positive integer larger than 1) which may be electrically connected to each other via two signals wires W1 and W2. One of the subsystems SUB1-SUBm (hereafter as "reference subsystem") may be biased by a controllable reference current, either centrally generated or externally supplied, in order to establish a differential voltage between a first terminal (designated by a node N1) and a second terminal (designated by a node N2) of the reference subsystem. The differential voltage may then be distributed as a reference signal to another one or multiple subsystems (hereafter as "destination subsystem") when needed. Based on the distributed reference signal, copy of the reference current may be reproduced on one or multiple destination subsystems.

In the reference signal distribution system 100 illustrated in FIG. 1 and the reference signal distribution system 200 illustrated in FIG. 2, each of the subsystems SUB1-SUBm may include a first-type transistor, a second-type transistor, a power supply and a power offset. QN1-QNm represent the first-type transistors of the subsystems SUB1-SUBm, respectively. QP1-QPm represent the second-type transistors of the subsystems SUB1-SUBm, respectively. QN1 and QP1 may also be referred to as diode-connected devices, because their gates are coupled to their drains. $V_{SUPPLY1}$-$V_{SUPPLYm}$ represent the power supplies of the subsystems SUB1-SUBm, respectively. $V_{OFFSET1}$-$V_{OFFSETm}$ represent the power offsets of the subsystems SUB1-SUBm, respectively. The transistors QN1-QNm and QP1-QPm may be, but not limited to, metal-oxide-semiconductor field-effect transistors (MOSFETs), bipolar junction transistors (BJTs), or another type of transistors having similar function. For illustrative purposes, each of the transistors QN1-QNm is depicted as a MOSFET having a first end (drain) and a control end (gate) connected together at the node N1, and each of the transistors QP1-QPm is depicted as a MOSFET having a first end (drain) and a control end (gate) connected together at the node N2 in FIGS. 1-4.

In an embodiment according to the present disclosure, the first-type transistors QN1-QNm and the second-type transistors QP1-QPm are doped with different types of carriers. For illustrative purposes, each of the first-type transistors QN1-QNm is depicted as a N type metal-oxide-semiconductor field-effect transistor (N-MOSFET), and each of the second-type transistors QP1-QPm is depicted as a P type metal-oxide-semiconductor field-effect transistor (P-MOSFET) in FIGS. 1-4.

For illustrative purposes, it is assumed that reference signals are provided in the reference subsystem SUB1 and then distributed to one or multiple destination subsystems SUB2-SUBm in order to generate copies of the reference signals. In an embodiment according to the present disclosure, a reference current $I_{REF}$ may be supplied into the drain of the first-type transistor QN1 by a reference current source IS in the reference subsystem SUB1, as depicted by the reference signal distribution system 100 illustrated in FIG. 1 and the reference signal distribution system 300 illustrated in FIG. 3. In another embodiment according to the present disclosure, a reference current $I_{REF}$ may be drawn from the drain of the second-type transistor QP1 by the reference current source IS in the reference subsystem SUB1, as depicted by the reference signal distribution system 200 illustrated in FIG. 2 and the reference signal distribution system 400 illustrated in FIG. 4.

In each subsystem of the reference signal distribution systems 100, 200, 300 and 400, the second ends (sources) of the first-type and second type transistors are connected together to create a floating complimentary metal-oxide-semiconductor (CMOS) series transistor pair. If the reference current $I_{REF}$ is supplied into the drain of the transistor QN1 or drawn from the drain of the transistor QP1, the floating CMOS series transistor pair formed by QN1 and QP1 may be biased to create a voltage difference between the two nodes N1 and N2. This differential voltage $V_{DIFF}$ established between the nodes N1 and N2 may be distributed to one or multiple subsystems SUB2-SUBm using two signal wires W1 and W2.

When the reference subsystem SUB1 is connected to the destination subsystem SUB2 via the two signal wires W1 and W2, the floating CMOS series transistor pair formed by QN2 and QP2 may be biased by the differential voltage $V_{DIFF}$. Consequently, a copy current $I_{COPY2}$ associated with the reference current $I_{REF}$ may flow through the load resistance of the destination subsystem SUB2. The value of the copy current $I_{COPY2}$ is determined by the ratio between the sizes of the transistors QN2 and QN1 and by the ratio between the sizes of the transistors QP2 and QP1.

In an embodiment when the transistors QN1, QP1, QN2 and QP2 have the same size in width, the copy current $I_{COPY2}$ flowing through the destination subsystem SUB2 may be (approximately) the same as the reference current $I_{REF}$ flowing through the reference subsystem SUB1, regardless of any differences (within certain limits) between the power supply $V_{SUPPLY1}$ of the reference subsystem SUB1 and the power supply $V_{SUPPLY2}$ of the destination subsystem SUB2 and regardless of any differences (within certain limits) between the power offset $V_{OFFSET1}$ of the reference subsystem SUB1 and the power offset $V_{OFFSET2}$ of the destination subsystem SUB2.

In another embodiment, the copy current $I_{COPY2}$ flowing through the destination subsystem SUB2 may be a scaled replica of the reference current $I_{REF}$ flowing through the reference subsystem SUB1. This can be achieved by scaling the width of the first-type transistor QN2 by the required scaling factor relative to the width of the first-type transistor QN1, and by scaling the width of the second-type transistor QP2 by the required scaling factor relative to the width of the second-type transistor QP1.

At least one benefit of the above described approach is that the reference current $I_{REF}$ can be reproduced anywhere in the reference signal distribution system 100, without the need to access or reference to the exact supply voltages used at the reference subsystem ($V_{SUPPLY1}$ and $V_{OFFSET1}$ of the reference subsystem SUB1).

Yet another benefit with the above described approach is that the reference current $I_{REF}$ can be reproduced multiple times without compromising the differential voltage between the signal lines W1 and W2. The reason is that the gates of all diode-connected devices in the destination subsystems draw no current from the nodes N1 and N2. Since the copy current $I_{COPY2}$ flowing through the destination subsystem SUB2 is solely dependent on the voltage difference between the nodes N1 and N2, the magnitude of the reproduced copy current $I_{COPY2}$ will be independent of local variations in supply voltages ($V_{SUPPLY2}$ and $V_{OFFSET2}$ of the destination subsystem SUB2).

Yet another benefit with the above described approach is the ability to reproduce any number or magnitude of copies of the original reference current without causing extra power dissipation. The reason is that distribution of a reference signal as a differential voltage using two signal wire consumes much less power than the prior art method of distributing all required copies of the reference current which are generated at the reference subsystem.

Yet another benefit with the above described approach is the ability to reproduce any number or magnitude of copies of the original reference current without causing circuit complexity. The reason is that distribution of a reference signal as a differential voltage according to the present disclosure only requires two signal wires, instead of using individual wires to distribute all required copies of the reference current to each destination in the prior art.

If higher precision in the reproduction of the reference currents, or greater independence from local supply variations, is required, a cascoded approach, as shown in FIG. 3 and FIG. 4, may be implemented. In the reference signal distribution system 300 illustrated in FIG. 3 and the reference signal distribution system 400 illustrated in FIG. 4, the reference subsystem SUB1 further includes two cascode bias V1 and V2, and each of the destination subsystem SUB2-SUBm further includes an additional first-type transistor and an additional second-type transistor coupled in series to the local CMOS series transistor pair. QN2'-QNm' represent the additional first-type transistors of the subsystems SUB2-SUBm, respectively. QP2'-QPm' represent the additional second-type transistors of the subsystems SUB2-SUBm, respectively. The transistors QN2'-QNm' and QP2'-QPm' may be, but not limited to, MOSFETs, BJTs, or another type of transistors having similar function. In FIG. 3 and FIG. 4 for illustrative purposes, the additional first-type transistors QN1'-QNm' of the subsystems SUB1-SUBm are depicted as NMOSFETS each having a first end (drain) and a control end (gate) connected together at a node N3, and the additional second-type transistors QP1'-QPm' of the subsystems SUB1-SUBm are depicted as PMOSFETS each having a first end (drain) and a control end (gate) connected together at a node N4.

In the destination subsystem SUB2 of the reference signal distribution system 200 illustrated in FIG. 3 and FIG. 4, the first-type transistor QN2 and the second-type transistor QP2 form a transconductance amplifier, and the additional first-type transistor QN2' and the additional second-type transistor QP2' forms a current buffer. The purpose of QN2' and QP2' is to ensure that QN2 and QP2 respectively, may each see a constant drain-to-source voltage and thus generate currents that are now independent of local supplies (within limits) or load resistance (within limits). Four signal wires W1-W4 are now required to transmit the reference signal from a reference subsystem to one or multiple destination subsystems in the reference signal distribution systems 300 and 400. The generated copies may still be dependent only on the differential voltage $V_{DIFF}$ between the nodes N1 and N2 and unaffected by the local variations in supply voltage or load resistance.

Figure 5:
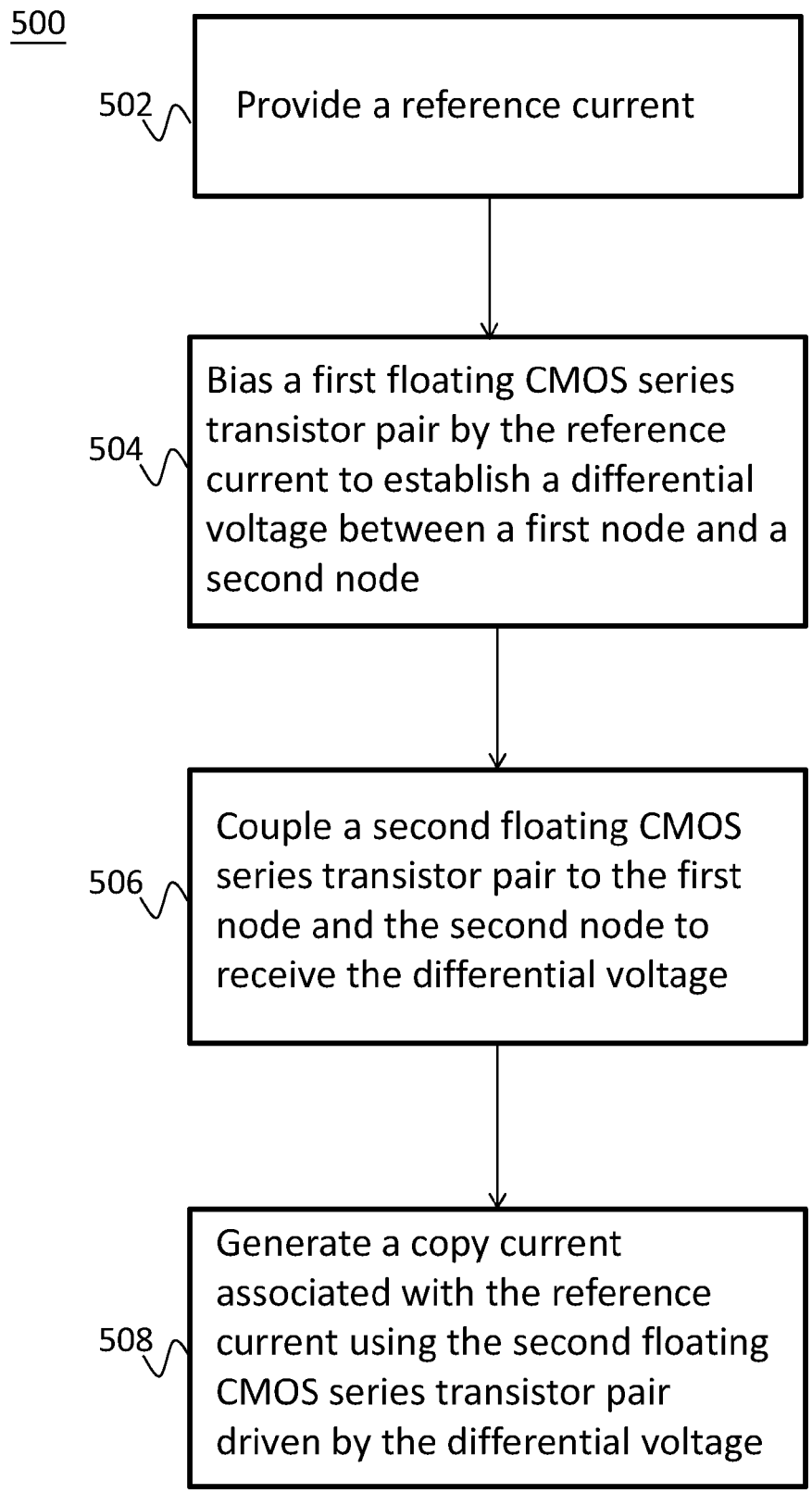
FIG. 5 is a flowchart of an illustrative embodiment of a method for operating the reference signal distribution reference signal distribution system, all arranged in accordance with at least some embodiments of the present disclosure.

FIG. 5 is a flowchart of an illustrative embodiment of a method to distribute reference signals in accordance with at least some embodiments of the present disclosure. Method 500 may include one or more operations, functions or actions as illustrated by one or more of blocks 502, 504, 506, and/or 508. The various blocks may be combined into fewer blocks, divided into additional blocks, and/or eliminated based upon the desired implementation. Method 500 may also be performed by a reference signal distribution system, such as the ones described in conjunction with FIGS. 1, 2, 3, and 4.

Processing for method 500 may begin at block 502, "provide a reference current". Block 502 may be followed by block 504, "bias a first floating CMOS series transistor pair by the reference current to establish a differential voltage between a first node and a second node." Block 504 may be followed by block 506, "couple a second floating CMOS series transistor pair to the first node and the second node to receive the differential voltage." Block 506 may be followed by block 508, "generate a copy current associated with the reference current using the second floating CMOS series transistor pair driven by the differential voltage."

Although the approach discussed above in conjunction with FIG. 1 to FIG. 5 principally refers to a reference current distribution system, it should be apparent to those skilled in the art to use such a reference signal distribution system to distribute reference voltages. More specifically, the current source IS in the reference signal distribution systems 100 and 200 may be replaced by a reference voltage source $V_{REF}$ in series with a resistor for providing the reference current $I_{REF}$. Copies of the reference current $I_{REF}$ may be reproduced at each destination subsystem and then converted back to copy voltages through a matched resistor at each destination subsystem. The reference current $V_{REF}$ can be reproduced anywhere and many times in the reference signal distribution systems 100 and 200 without the need to access or reference to the exact supply voltages used at the reference subsystem, without compromising the differential voltage between the signal lines W1 and W2, and without causing extra power dissipation or circuit complexity.

Although the present disclosure has been described with reference to specific exemplary embodiments, it will be recognized that the disclosure is not limited to the embodiments described, but can be practiced with modification and alteration within the spirit and scope of the appended claims. Accordingly, the specification and drawings are to be regarded in an illustrative sense rather than a restrictive sense.

I claim:

1. A reference signal distribution system, comprising:
    a first subsystem biased by a reference current and configured to establish a differential voltage between a first node and a second node; and
    a second subsystem driven by the differential voltage and configured to generate a copy current associated with the reference current, the second subsystem comprising:
        a first transistor, including:
            a first end;
            a second end; and
            a control end connected to the first node; and
        a second transistor, including:
            a first end;
            a second end connected to the second end of the first transistor; and
            a control end connected to the second node.

2. The reference signal distribution system of claim 1, wherein the first subsystem comprises:
    a third transistor, including:
        a first end coupled to the first node;
        a second end; and
        a control end coupled to the first end of the third transistor; and
    a fourth transistor, including:
        a first end coupled to the second node;
        a second end connected to the second end of the third transistor; and
        a control end coupled to the first end of the fourth transistor.

3. The reference signal distribution system of claim 2, wherein a ratio between the copy current and the reference current is associated with a ratio between a size of the first transistor and a size of the third transistor, and associated with a ratio between a size of the second transistor and a size of the fourth transistor.

4. The reference signal distribution system of claim 2, wherein:
    the first transistor and the third transistor are transistors of a first doping type; and
    the second transistor and the fourth transistor are transistors of a second doping type different from the first doping type.

5. The reference signal distribution system of claim 2, wherein the second subsystem further comprises:
    a fifth transistor, including:
        a first end configured to receive the copy current;
        a second end coupled to the first end of the first transistor; and
        a control end coupled to a third node; and
    a sixth transistor, including:
        a first end;
        a second end coupled to the first end of the second transistor; and
        a control end coupled to a fourth node.

6. The reference signal distribution system of claim 5, wherein the first subsystem further comprises:
    a first cascode bias coupled between the first node and the third node; and
    a second cascode bias coupled between the second node and the fourth node.

7. The reference signal distribution system of claim 5, wherein:
    the first transistor, the third transistor, and the fifth transistor are transistors of a first doping type; and
    the second transistor, the fourth transistor, and the sixth transistor are transistors of a second doping type different from the first doping type.

8. The reference signal distribution system of claim 1, wherein:
    the first subsystem further comprises:
        a voltage source configured to supply a reference voltage; and
        a first resister coupled in series to the voltage source to convert the reference voltage into the reference current; and
    the second subsystem further comprises:
        a second resister configured to convert the copy current into a copy voltage, wherein the copy voltage is associated with the reference voltage.

9. A method of distributing reference signals, comprising:
providing a reference current in a first subsystem that includes a first floating complimentary metal-oxide-semiconductor (CMOS) series transistor pair coupled between a first node and a second node;
biasing the first floating CMOS series transistor pair by the reference current to establish a differential voltage between the first node and the second node;
coupling a second floating CMOS series transistor pair of a second subsystem to the first node and the second node to receive the differential voltage; and
generating a copy current associated with the reference current at the second subsystem using the second floating CMOS series transistor pair driven by the differential voltage.

10. The method of claim 9, further comprising:
providing a reference voltage at the first subsystem;
converting the reference voltage into the reference current at the first subsystem;
converting the copy current into a copy voltage at the first subsystem, wherein the copy voltage is associated with the reference voltage.

11. The method of claim 9, further comprising:
coupling a first end of the second floating CMOS series transistor pair to a power supply via a first current buffer at the second subsystem; and
coupling a second end of the second floating CMOS series transistor pair to a power offset via a second current buffer at the second subsystem.

* * * * *